(12) United States Patent
Glodde et al.

(10) Patent No.: US 9,460,934 B2
(45) Date of Patent: Oct. 4, 2016

(54) WET STRIP PROCESS FOR AN ANTIREFLECTIVE COATING LAYER

(71) Applicants: GLOBALFOUNDRIES INC., Grand Cayman (KY); SHIN-ETSU Chemical Company, Ltd., Tokyo (JP)

(72) Inventors: Martin Glodde, Mahwah, NJ (US); Wu-Song Huang, Brewster, NY (US); Javier J. Perez, Wappingers Falls, NY (US); Takeshi Kinsho, Niigata (JP); Tsutomu Ogihara, Niigata (JP); Seiichiro Tachibana, Niigata (JP); Takeru Watanabe, Niigata (JP)

(73) Assignee: GLOBALFOUNDRIES INC., Grand Cayman (KY)

( * ) Notice: Subject to any disclaimer, the term of this patent is extended or adjusted under 35 U.S.C. 154(b) by 431 days.

(21) Appl. No.: 13/833,317

(22) Filed: Mar. 15, 2013

(65) Prior Publication Data
US 2014/0273501 A1    Sep. 18, 2014

(51) Int. Cl.
| | |
|---|---|
| H01L 21/76 | (2006.01) |
| H01L 21/311 | (2006.01) |
| H01L 21/027 | (2006.01) |
| G03F 7/075 | (2006.01) |
| G03F 7/09 | (2006.01) |

(52) U.S. Cl.
CPC ........ H01L 21/31111 (2013.01); G03F 7/0752 (2013.01); G03F 7/091 (2013.01); H01L 21/0276 (2013.01)

(58) Field of Classification Search
None
See application file for complete search history.

(56) References Cited

U.S. PATENT DOCUMENTS

| | | |
|---|---|---|
| 5,911,836 A | 6/1999 | Hada et al. |
| 6,103,637 A | 8/2000 | Torek et al. |
| 6,683,008 B1 | 1/2004 | Cotte et al. |

(Continued)

FOREIGN PATENT DOCUMENTS

| | | |
|---|---|---|
| KR | 1020020010444 | 2/2002 |

OTHER PUBLICATIONS

Madou, Fundamentals of Microfabrication and Nanotechnology, 2011, CRC Press, first 3 paragraphs under the heading Ion-Beam Lithography.*

(Continued)

*Primary Examiner* — Binh X Tran
*Assistant Examiner* — David Cathey, Jr.
(74) *Attorney, Agent, or Firm* — Scully, Scott, Murphy & Presser, P.C.

(57) ABSTRACT

An silicon-containing antireflective coating (SiARC) material is applied on a substrate. The SiARC material which includes a base polymer and may include a boron silicate polymer including silsesquioxane. An etch sequence is utilized, which includes a first wet etch employing a basic solution, a second wet etch employing an acidic solution, and a third wet etch employing another basic solution. The first wet etch can be employed to break up the boron silicate polymer, and the second wet etch can remove the base polymer material, and the third wet etch can remove the residual boron silicate polymer and other residual materials. The SiARC material can be removed from a substrate employing the etch sequence, and the substrate can be reused for monitoring purposes.

20 Claims, 1 Drawing Sheet

(56) References Cited

U.S. PATENT DOCUMENTS

| | | | |
|---|---|---|---|
| 7,087,996 | B2 | 8/2006 | Danielson et al. |
| 7,393,819 | B2 | 7/2008 | Hsu |
| 7,700,533 | B2 | 4/2010 | Egbe et al. |
| 8,026,201 | B2 | 9/2011 | Zhang et al. |
| 2004/0256358 | A1* | 12/2004 | Shimizu et al. ............... 216/83 |
| 2005/0176602 | A1 | 8/2005 | Hsu |
| 2008/0138997 | A1 | 6/2008 | Huang et al. |
| 2011/0076623 | A1* | 3/2011 | Fitrianto ....................... 430/323 |
| 2011/0207047 | A1* | 8/2011 | Burns et al. ............... 430/270.1 |
| 2012/0077132 | A1 | 3/2012 | Quillen et al. |

OTHER PUBLICATIONS

Kovacs, G. et al., "Bulk Micromachining of Silicon" Proceedings of the IEEE (Aug. 1998) pp. 1536-1551, vol. 86, No. 8.

International Search Report dated May 15, 2014 issued in International Application No. PCT/US2014/016700.

Le, Q.T. et al., "Removal of post-etch photoresist and sidewall residues using organic solvent and additive combined with physical forces", Feb. 2009, Microelectronic Engineering, vol. 86, Issue 2, Elsevier Science, Ltd.

N-Methyl-2-pyrrolidone, Wikipedia, wn.wikipedia.org/wiki/N-Methyl-2-pyrrolidone, last printed Jan. 1, 2013, pp. 1-2.

* cited by examiner

WET STRIP PROCESS FOR AN ANTIREFLECTIVE COATING LAYER

BACKGROUND

The present disclosure relates to a method of processing a material layer, and particularly to a method of stripping an antireflective coating (ARC) layer from a substrate.

Photolithography is a process used in micro fabrication to selectively remove parts of a thin film or the bulk of a substrate. Photolithography uses light to transfer a geometric pattern from a photo mask to a light-sensitive photoresist, or simply "resist," on the substrate. A series of chemical treatments then engrave the exposure pattern into the material underneath the photoresist. Typically, for negative tone development (NTD) the portion of the resist which has not been exposed to light is removed by an organic solvent during the development process, the most commonly used solvents are 2-heptanone and n-butyl acetate (NBA).

A strong demand exists for techniques that extend application of ArF immersion lithography. Besides techniques such as litho-friendly design, dual exposure/patterning schemes, customized illumination, alternative processing schemes are also viable candidates. One of the most promising alternative flows is to use image reversal by means of NTD. Traditionally, contact and trench printing use a dark-field mask in combination with positive tone resist and positive tone development (PTD). With NTD, the same features are printed in positive resist using bright-field masks, and consequently better image contrasts are provided.

An integrated process is needed to achieve this image contrast, before the final pattern is engraved, an organic planarization layer (OPL) is applied on top of the substrate, then a silicon-containing antireflective coating (SiARC) material designed for NTD application is coated to provide etch resistance and reflectivity control, and finally, an photoresist material is applied to provide the initial image transfer to the substrate. However, new challenges come with the introduction of NTD SiARC, especially the wet strip process was used to remove the NTD SiARC from Si monitor wafers. Many SiARC materials cannot be removed completely during this wet strip process using the common process flows used in the manufacture.

BRIEF SUMMARY

A silicon-containing antireflective coating (SiARC) material is applied on a substrate. The SiARC material which includes a base polymer and may include a boron silicate polymer including silsesquioxane. An etch sequence is utilized, which includes a first wet etch employing a basic solution, a second wet etch employing an acidic solution, and a third wet etch employing another basic solution. The first wet etch can be employed to break up the boron silicate polymer, and the second wet etch can remove the base polymer material, and the third wet etch can remove the residual boron silicate polymer and other residual materials. The SiARC material can be removed from a substrate employing the etch sequence, and the substrate can be reused for monitoring purposes.

According to an aspect of the present disclosure, a method for removing a silicon-containing antireflective coating (SiARC) layer from a substrate is provided. A SiARC layer is formed on a substrate. The SiARC layer is treated by a first wet etch employing a first basic solution. The SiARC layer is then treated by a second wet etch employing an acidic solution. Subsequently, residual portions of the SiARC layer is removed by a third wet etch employing a second basic solution.

DETAILED DESCRIPTION

Figure 1:
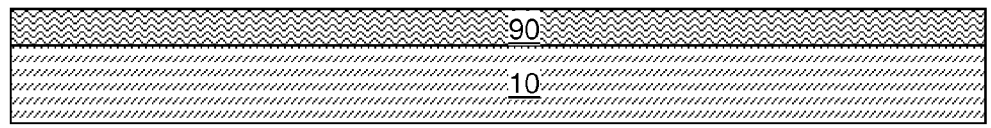
FIG. 1 is a vertical cross-sectional view of an exemplary structure including a polymer layer on a substrate according to an embodiment of the present disclosure.

As stated above, the present disclosure relates to a method of stripping an antireflective coating (ARC) layer from a substrate, which is now described in detail with accompanying figures. It is noted that like and corresponding elements are referred to by like reference numerals. The drawings are not in scale.

Referring to FIG. 1, a polymer layer 90 is formed on a top surface of a substrate 10. The substrate 10 can be a semiconductor substrate such as a silicon substrate, an insulator substrate, or a conductor substrate. The top surface of the substrate 10 can be a semiconductor surface such as a silicon surface, a dielectric surface such as a silicon oxide surface or a silicon nitride surface, or can be a conductive surface such as a surface of a metal layer or a conductive metal nitride layer. In one embodiment, the substrate 10 can be a bare silicon substrate having a silicon top surface.

The polymer layer 90 includes a silicon-containing antireflective coating (SiARC) material. As used herein, an antireflective coating material refers to a material that reduces reflection of ultraviolet light at a wavelength selected from the range of ultraviolet radiation, i.e., the wavelength range from 10 nm to 400 nm. The polymer layer 90 can be a monitor substrate for monitoring the thickness of an antireflective coating (ARC) layer to be applied or previously applied on a product substrate, i.e., a substrate including patterned structures for manufacturing semiconductor devices thereupon. The thickness of the polymer layer 90 can be from 10 nm to 100 nm, although lesser and greater thicknesses can also be employed.

The material composition of the polymer layer 90 can be employed as a positive tone development (PTD) silicon-containing antireflective coating (SiARC) material. It also can be used as a negative tone (NTD) SiARC material. In other words, the composition of the polymer layer 90 can be employed as an ARC layer for a negative tone development (NTD), i.e., as an NTD ARC layer. The NTD ARC layer can be applied on a product substrate as a bottom ARC (BARC) layer over which a negative tone development photoresist layer can be applied.

The SiARC material mainly contains a silicon containing base polymer. The silicon-containing base polymer may contain one or more monomer units having structures selected from (I) to (III) below:

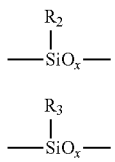

where x ranges from approximately 1 to approximately 2, $R_1$ is a chromophore moiety, $R_2$ is a transparent moiety, and $R_3$ is a reactive site for reaction with a crosslinking component. For linear organosiloxane polymers, x would be approximately 1. For silsesquioxane polymers, x may be approximately 1.5. For silsesquioxane polymers containing a $SiO_2$ component, x may be between approximately 1.5 and approximately 2.0. The $SiO_2$ units in the polymer may be obtained by adding tetraalkoxysilane, tetrachlorosilane, or tetrabromosilane in the synthesis of the silicon containing polymer. In some embodiments, polymers having x greater than approximately 1.5 are preferred due to superior etch resistance. In some embodiments, multiple functional moieties may be present on the same monomer.

The chromophore moiety $R_1$ may contain any suitable chromophore which (i) can be grafted onto the base polymer, (ii) has suitable radiation absorption characteristics, and (iii) does not adversely affect the performance of the layer or any overlying photoresist layers. Example chromophores include phenyl, chrysenes, pyrenes, fluoroanthrenes, anthrones, benzophenones, thioxanthones, naphthalenes and anthracenes. The chromophore moiety preferably does not contain nitrogen, except for possibly deactivated amino nitrogen such as in phenol thiazine. For 193 nm radiation, any moieties with unsaturated carbon bonds (e.g., carbon-carbon double bonds) including non-aromatic compounds containing unsaturated carbon bonds are also suitable chromophores. For 157 nm radiation, compounds containing saturated carbon-carbon bonds can act as chromophores. Approximately 3 to approximately 99 mole % of the monomers of the base polymer may consist of the chromophore moiety $R_1$. The base polymer may include more than one type of chromophore moiety $R_1$.

The transparent moiety $R_2$ may vary depending on the wavelength or character of the patterning radiation. For example, in the case of 193 nm imaging radiation, the transparent moiety $R_2$ may be bulky ($C_1$ or higher) organic moieties substantially free of unsaturated carbon-carbon bonds, preferably an alcohol derived from an epoxy-functionalized silsesquioxane monomer. In the case of 157 nm imaging radiation, the transparent moiety $R_2$ may be fluorine-containing moieties such as a trifluoromethyl group or perfluoroalkyl. The amount of the transparent moiety $R_2$ in the base polymer may be balanced with the amount of the chromophore moiety $R_1$ to provide a desired combination of energy absorption and anti-reflection. Approximately 0.5 to approximately 96.5 mole % of the monomers of the base polymer may consist of the transparent moiety $R_2$. The base polymer may include more than one type of transparent moiety $R_2$.

The reactive moiety $R_3$ provides a site for reaction with a crosslinking component. In some embodiments, reactive moiety $R_3$ may be an alcohol, preferably an aromatic alcohol (e.g., phenol, hydroxymethylbenzyl) or a cycloaliphatic alcohol (e.g. cyclohexanol). Alternatively, a non-cyclic alcohol such as a fluorocarbon alcohol, an aliphatic alcohol, an amino group, a vinyl ether, or an epoxide may be used. In one embodiment, the reactive moiety may be a hydroxyl group. The reactive hydroxyl moiety can react with itself through the known silanol condensation reaction. Approximately 0.5 to approximately 96.5 mole % of the monomers of the base polymer may consist of the reactive moiety $R_3$. The base polymer may include more than one type of the reactive moiety $R_3$.

For applications specifically for NTD, the SiARC material may further contain a polymer capable of modifying the surface property of the base polymer including a monomer unit having a structure below:

$$\begin{array}{c} R_4 \\ | \\ -SiO_x- \end{array} \quad (IV)$$

where x ranges from approximately 1 to approximately 2, $R_4$ consists of an acid labile functionality linked to a hydrophilic group. Exemplary acid labile functionalities include tertiary alkyl carbonates, tertiary alkyl esters, tertiary alkyl ethers, acetals and ketals. Exemplary hydrophilic groups include phenols, alcohols, carboxylic acids, amides, and sulfonamides. The polymer contains monomer unit IV can be added to the base polymer to increase the contact angle of the coated SiARC material to a more hydrophobic surface. It will then decrease its contact angle to a more hydrophilic surface after acid catalyzed deprotection of the acid labile group.

In some embodiments, the polymer layer 90 includes a base polymer material. The base polymer material contains a large portion of three dimensional linked $SiO_2$ units. The weight percentage of silicon in the base polymer layer can be in a range from 10% to 45%. The preferred range is above 30%. The mole percentage of $SiO_2$ units can be in a range from 0% to 97%. The preferred mole percentage of SiO2 units is above 45%. In some other embodiments, the polymer layer 90 includes a base polymer and a polymer containing monomer unit IV. The polymer containing monomer IV is capable of modifying the surface property of the base polymer. In the polymer layer 90, the polymer capable of modifying the surface property of the base polymer material is mixed with the base polymer material such that the ratio of the weight of the polymer capable of modifying the surface property of the base polymer material to the weight of the base polymer material is in a range from 0.5:100 to 20:100.

In one embodiment, the polymer layer 90 includes a base polymer material and a boron silicate polymer embedded in the base polymer material. The base polymer material contains a large portion of three dimensional linked $SiO_2$ units (Q units). The base polymer material is a silicon-based polymer material. The weight percentage of silicon in the base polymer layer can be in a range from 35% to 45%. In one embodiment, the base polymer material can include a high-Q polymer material known in the art. An example of a high-Q polymer material is disclosed in U.S. Patent Application Publication No. 2013/0005150 A1, the contents of which are incorporated herein by reference.

The base polymer material includes a plurality of types of monomer units. In one embodiment, the plurality of types of monomer units can include monomer units of a first type, monomer units of a second type, and monomer units of a third type. In one embodiment, the base polymer material can consist of monomer units of the first, second, and third types.

The monomer units of the first type for the base polymer material can have a chemical composition of:

The monomer units of the first type make the polymer layer 90 to be susceptible to a wet etch based on hydrofluoric acid.

The monomer units of the second type for the base polymer material can have a chemical composition of:

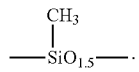

The monomer units of the second type provide transparency at 193 nm to tune the absorption property of the polymer. The monomer units of the second type also provides adhesion to the undercoat organic planarization layer and/or the overcoat photoresist.

The monomer units of the third type for the base polymer material can have a chemical composition of:

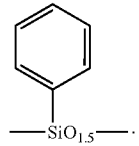

The monomer units of the third type provide absorption of 193 nm ultraviolet light in the polymer layer 90 so that the polymer layer can be used as an ARC material.

The monomer units of the first type can collectively have a mole percentage greater than 70% of the base polymer material. In one embodiment, the monomer units of the first type can collectively have a mole percentage in a range from 75% to 95% of the base polymer material.

In another embodiment, the monomer units of the first type can have a mole percentage in a range from 80% to 94% of the base polymer material.

The monomer units of the second type can collectively have a mole percentage in a range from 0.1% to 15% of the base polymer material. In one embodiment, the monomer units of the second type can have a mole percentage in a range from 0.2% to 10% of the total weight of the base polymer material.

The monomer units of the third type can collectively have a mole percentage in a range from 1% to 15% of the base polymer material. In one embodiment, the monomer units of the third type can have a mole percentage in a range from 2% to 12% of the base polymer material.

The boron silicate polymer material contains an acid labile group that causes the SiARC material of the polymer layer 90 to change water contact angle after lithographic exposure. As used herein, a boron silicate polymer material is a polymer material that includes silicates and boron. The ratio of the number of silicon atoms to the number of boron atoms in the boron silicate polymer material can be in a range from 1:2 to 2:1, although lesser and greater ratios can also be employed. An example of a boron silicate polymer is disclosed in U.S. Patent Application Publication No. 2013/0005150 A1.

The boron silicate polymer material includes monomer units of a plurality of types. The boron silicate polymer is a polymeric surfactant. In one embodiment, the monomer units of the plurality of types can include monomers of a first type, monomers of a second type, and monomers of a third type. The monomer units of the first type can include a boron atom. The monomer units of the second type and the monomer unit of the third type can include a silicon atom. In one embodiment, the boron silicate polymer material can consist of the monomer units of the first, second, and third types.

The monomer units of the first type for the boron silicate polymer material can have a chemical composition of:

The monomer units of the second type for the boron silicate polymer material can have a chemical composition of:

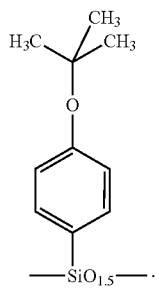

The monomer units of the third type for the boron silicate polymer material can have a chemical composition of:

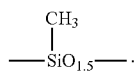

The monomer units of the first type can collectively have a mole percentage greater than 35% of the boron silicate polymer material. In one embodiment, the monomer units of the first type can collectively have a mole percentage in a range from 40% to 70% of the boron silicate polymer material. In another embodiment, the monomer units of the first type can have a mole percentage in a range from 45% to 60% of the boron silicate polymer material. In one embodiment, the monomer units of the first type can collectively have a mole percentage not less than 50% of the boron silicate polymer material.

The monomer units of the second type can collectively have a mole percentage in a range from 12.5% to 35% of the boron silicate polymer material. In one embodiment, the monomer units of the second type can have a mole percentage in a range from 20% to 30% of the boron silicate polymer material.

The monomer units of the third type can collectively have a mole percentage in a range from 12.5% to 35% of the boron silicate polymer material. In one embodiment, the monomer units of the third type can have a mole percentage in a range from 20% to 30% of the boron silicate polymer material.

In the polymer layer 90, the boron silicate polymer material is mixed with the base polymer material such that the ratio of the weight of the boron silicate polymer material to the weight of the base polymer material is in a range from 0.5:100 to 20:100. In one embodiment, the ratio of the weight of the boron silicate polymer material to the weight of the base polymer material is in a range from 1:100 to 10:100. In another embodiment, the ratio of the weight of the boron silicate polymer material to the weight of the base polymer material is in a range from 2:100 to 5:100. The polymer layer 90 can be applied to the top surface of the substrate 10, for example, by spin coating.

The boron silicate polymer material contains acid labile group having tendency to form insoluble material during the conventional stripping process. The base polymer material forms a silicon-based polymeric matrix in which the boron silicate polymer material is embedded. Due to strong molecular interaction, it is difficult to break up the boron silicate polymer material during the wet etch process known in the art. This property causes defects to be left on a substrate upon attempts to remove the NTD SiARC material from the substrate when conventional etch processes are employed.

The inability to remove the NTD SiARC material without generating defects adversely impacts productivity of a semiconductor manufacturing facility because the substrates cannot be reused to monitor performance of tools employed to monitor application of the NTD SiARC material.

Figure 2:
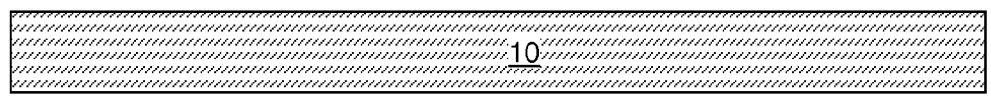
FIG. 2 is a vertical cross-sectional view of the exemplary structure after removal of the polymer layer from the substrate according to an embodiment of the present disclosure.
Figure 3:
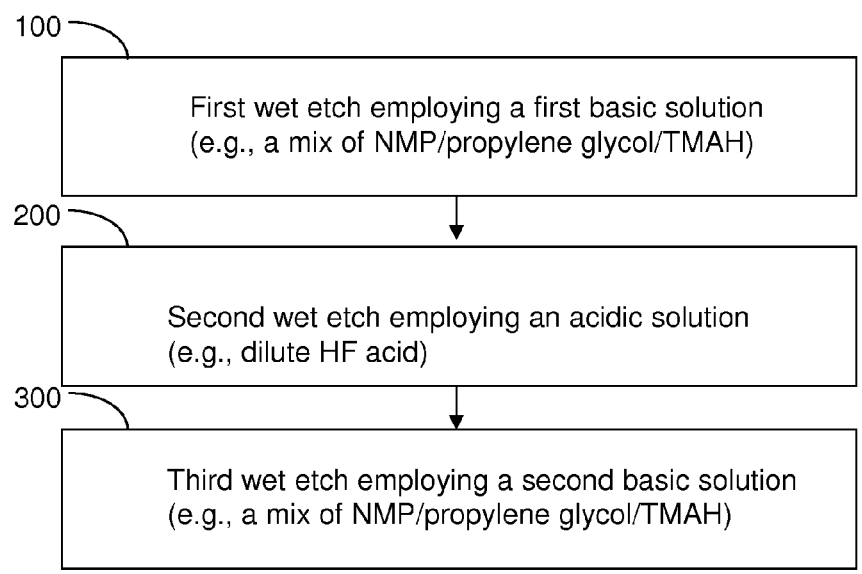
FIG. 3 is a flow chart illustrating a wet etch process sequence according to an embodiment of the present disclosure.

Referring to FIG. 2, the polymer layer 90 can be removed from above the top surface of the substrate 10 by a wet etch sequence without leaving residues or defect materials on the surface of the substrate 10 according to an embodiment of the present disclosure. The wet etch sequence of the present disclosure is a three-step wet etch sequence, which is illustrated in FIG. 3.

The wet etch sequence includes a first step 100 of a first wet etch employing a basic solution, a second step 200 of a second wet etch employing an acidic solution, and a third step 300 of a third wet etch employing the basic solution. The first wet etch can dissolve base soluble components of the polymer including silicon polymer with remaining hydroxyl group or the slow break down of the O—Si—O or Si—R linkages with base catalyzed hydrolysis. The R group here represents organic moiety. The first etch can also dissolve any organic components which are soluble in base. The second wet etch can remove the main —$SiO_x$— component due to the known dissolution of Si materials in hydrofluoric acid solutions. The third wet etch can then remove any residual organic and inorganic components. This inventive process can be applied to most of the SiARC materials known in the art including PTD SiARC's and NTD SiARC's. It is specially useful for NTD SiARC which the conventional rework process cannot fully remove the SiARC materials and leaves a lot of defects on the wafer.

In one embodiment, this inventive process was successfully used to remove the SiARC materials having a base polymer containing one or more monomer units having structures selected from (I) to (III). In the other embodiment, this inventive process was successfully used to remove the NTD SiARC materials having a base polymer and a polymer capable of modifying the surface property of the base polymer including a monomer unit having a structure of IV. In another embodiment, this inventive process was successfully used to remove the NTD SiARC materials having a base polymer and a boron silicate polymer.

The first wet etch can be employed to break up the boron silicate polymer, and the second wet etch can remove the base polymer material, and the third wet etch can remove the residual boron silicate polymer and other residual materials. The SiARC material of the polymer layer 90, which contains the boron silicate polymer, can be removed from the substrate employing the etch sequence, and the substrate 10 can be reused for monitoring purposes.

Referring to the first step 100, the embedded boron silicate polymer material in the polymer layer 90 is removed selectively to the base polymer material in the polymer layer 90 by the first wet etch that employs the first basic solution. During the first wet etch, the first basic solution of the first wet etch hydrolyzes and dissolves most of the boron silicate polymer material. In one embodiment, the embedded boron silicate polymer material may be removed selectively to the base polymer material by the first wet etch, i.e., without removing the base polymer material in the silicon-based polymeric matrix.

The duration of the first wet etch depends on the thickness of the polymer layer 90. For a thickness of 50 nm for the polymer layer 90, the duration of the first wet etch can be in a range from 2 minutes to 30 minutes, although lesser and greater durations can also be employed.

The basic solution used in the first wet etch may contain amines or quaternary ammonium hydroxides. Aqueous ammonium hydroxides are preferred. Examples of quaternary ammonium hydroxides which can be used in accordance with the process of the present invention include tetramethylammonium hydroxide (TMAH), tetraethylammonium hydroxide, tetrapropylammonium hydroxide, trimethylhydroxyethylammonium hydroxide, dimethyldihydroxyethylammonium hydroxide, methyltrihydroxyethylammonium hydroxide, phenyltrimethylammonium hydroxide, phenyltriethylammonium hydroxide, benzyltri-methylammonium hydroxide, etc. In one embodiment, 0.263N TMAH aqueous solution was used as the first wet etch solution. Organic solvents are useful in dissolving and wetting the organic components of the SiARC materials, therefore can be added in with quaternary ammonium hydroxide to form the first wet etch solution.

In one embodiment, the first basic solution includes at least N-methyl-2-pyrrolidone, propylene glycol, and tetramethylammonium hydroxide. The weight percentage of N-methyl-2-pyrrolidone can be in a range from 50% to 90%. In one embodiment, the weight percentage of N-methyl-2-pyrrolidone can be in a range from 67% to 77%. The weight percentage of propylene glycol can be in a range from 10% to 40%. In one embodiment, the weight percentage of propylene glycol can be in a range from 21% to 31%. The weight percentage of tetramethylammonium hydroxide can be in a range from 1% to 5%. In one embodiment, the weight percentage of tetramethylammonium hydroxide can be in a range from 1.2% to 2.7%. Optionally, the first basic solution can include water. If water is present in the first basic solution, the weight percentage of water can be in a range from 0.1% to 2%.

Referring to the second step 200, the base polymer material of the silicon-based polymeric matrix in the polymer layer 90 is removed by the second wet etch that employs the acidic solution. An acid that can effectively dissolve the monomer units of the first type, i.e., $SiO(OH)_2$ can be selected for the acidic solution. The second wet etch is not effective in removing the boron silicate polymer material. In one embodiment, more than 90% of the material of the base polymer material is removed by the second wet etch. In another embodiment, more than 99% of the material of the base polymer material is removed by the second wet etch.

During the second wet etch, the acidic solution can easily penetrates into the bulk of the SiARC material because of microcavities formed by removal of the boron silicate polymer. The acidic solution dissolves the base polymer material. The duration of the second wet etch depends on the thickness of the polymer layer 90. For a thickness of 50 nm for the polymer layer 90, the duration of the second wet etch can be in a range from 2 minutes to 20 minutes, although lesser and greater durations can also be employed.

In one embodiment, the acidic solution includes diluted hydrofluoric acid. In one embodiment, the diluted hydrofluoric acid includes hydrofluoric acid at a weight percentage in a range from 0.1% to 2.0%. In another embodiment, the diluted hydrofluoric acid includes hydrofluoric acid at a weight percentage in a range from 0.2% to 1.0%. In yet another embodiment, the acidic solution can consist essentially of the diluted hydrofluoric acid.

Referring to the third step 300, residual portions of the boron silicate polymer material and the base polymer material are removed by a third wet etch employing a second basic solution.

The second basic solution treatment removes any remaining boron silicate polymer and any residual base polymer. The duration of the third wet etch depends on the thickness of the polymer layer 90. For a thickness of 50 nm for the polymer layer 90, the duration of the third wet etch can be in a range from 2 minutes to 30 minutes, although lesser and greater durations can also be employed.

In one embodiment, the second basic solution includes at least N-methyl-2-pyrrolidone, propylene glycol, and tetramethylammonium hydroxide. The weight percentage of N-methyl-2-pyrrolidone can be in a range from 50% to 90%. In one embodiment, the weight percentage of N-methyl-2-pyrrolidone can be in a range from 67% to 77%. The weight percentage of propylene glycol can be in a range from 10% to 40%. In one embodiment, the weight percentage of propylene glycol can be in a range from 21% to 31%. The weight percentage of tetramethylammonium hydroxide can be in a range from 1% to 5%. In one embodiment, the weight percentage of tetramethylammonium hydroxide can be in a range from 1.2% to 2.7%. Optionally, the second basic solution can include water. If water is present in the second basic solution, the weight percentage of water can be in a range from 0.1% to 2%. In one embodiment, the second basic solution can have any composition that can be employed for the first basic solution. The composition of the second basic solution can be the same as, or can be different from, the composition of the first basic solution.

The wet etch process sequence can completely eliminate the SiARC material layer from the substrate 10. The wet etch process sequence has been demonstrated to provide superior results compared to other wet etch process sequences. A comparative exemplary wet etch sequence, which includes a first wet etch employing a combination of a sulfuric acid and hydrofluoric acid, a second wet etch employing a combination of deionized water, hydrogen peroxide, and ammonium hydroxide, and a third wet etch employing dilute hydrofluoric acid, was shown to be insufficient to remove a SiARC material layer completely without residual polymers.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method for removing a silicon-containing antireflective coating (SiARC) layer from a substrate, said method comprising:
   forming a SiARC layer comprising a silicon-containing base polymer and a boron silicate polymer capable of modifying a surface property of said base polymer on a substrate;
   treating said SiARC layer by a first wet etch employing a first basic solution that removes said boron silicate polymer;
   treating said SiARC layer by a second wet etch employing an acidic solution that removes said silicon-containing base polymer; and
   removing residual portions of said SiARC layer by a third wet etch employing a second basic solution.

2. The method of claim 1, wherein said first basic solution comprises quaternary ammonium hydroxide.

3. The method of claim 2, wherein said first basic solution includes:
   N-methyl-2-pyrrolidone;
   propylene glycol at a weight percentage in a range from 10% to 40%; and
   tetramethylammonium hydroxide at a weight percentage in a range from 1% to 5%.

4. The method of claim 3, wherein said first basic solution further includes water at a weight percentage in a range from 0.1% to 2%.

5. The method of claim 1, wherein said acidic solution includes diluted hydrofluoric acid.

6. The method of claim 5, wherein said diluted hydrofluoric acid includes hydrofluoric acid at a weight percentage in a range from 0.1% to 2.0%.

7. The method of claim 5, wherein said acidic solution consists essentially of said diluted hydrofluoric acid.

8. The method of claim 2, wherein said first basic solution comprises an aqueous tetramethylammonium hydroxide solution.

9. The method of claim 8, wherein said aqueous tetramethylammonium hydroxide solution is 0.263N tetramethylammonium hydroxide solution.

10. The method of claim 1, wherein said silicon-containing base polymer comprises one or more monomer units selected from the group consisting of:

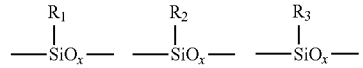

wherein x ranges from approximately 1 to approximately 2, $R_1$ is a chromophore moiety, $R_2$ is a transparent moiety that is transparent to a wavelength of a patterning radiation selected from the group consisting of 193 nm and 157 nm, and $R_3$ is a reactive site for reaction with a crosslinking component.

11. The method of claim 10, wherein said chromophore moiety contains unsaturated carbon-carbon bonds.

12. The method of claim 10, wherein said reactive site is selected from the group consisting of hydroxyl groups, amino groups, imino groups, carboxylic acids, vinyl ethers, epoxides and mixtures thereof.

13. The method of claim 10, wherein said boron silicate polymer comprises at least one monomer unit of:

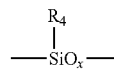

where x ranges from approximately 1 to approximately 2, $R_4$ consists of an acid labile functionality linked to a hydrophilic group.

14. The method of claim 13, wherein said acid labile functionality is selected from the group consisting of tertiary alkyl carbonates, tertiary alkyl esters, tertiary alkyl ethers, acetals and ketals.

15. The method of claim 13, wherein said hydrophilic side group is selected from the group consisting of phenols, alcohols, carboxylic acids, amides, and sulfonamides.

16. The method of claim 13, wherein a weight ratio of said polymer capable of modifying surface property of said base polymer to said base polymer is in a range from 0.5:100 to 20:100.

17. The method of claim 13, wherein said boron silicate polymer further comprising at least one monomer unit of:
—$BO_{1.5}$—. 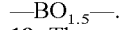

18. The method of claim 10, wherein said silicon-containing base polymer comprises monomer units including:
monomer units of a first type having a chemical composition of —$SiO_2$—,
monomer units of a second type having a chemical composition of

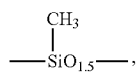

and
monomer units of a third type having a chemical composition of

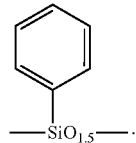

19. The method of claim 17, wherein said boron silicate polymer includes:
monomer units of a first type having a chemical composition of —$BO_{1.5}$—,
monomer units of a second type having a chemical composition of

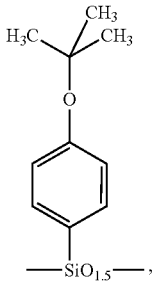

and
monomer units of a third type having a chemical composition of

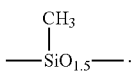

20. The method of claim 19, wherein said monomer units of said first type has a mole percentage greater than 40% of said boron silicate polymer.

* * * * *